US008236666B2

(12) United States Patent
Hiramatsu et al.

(10) Patent No.: US 8,236,666 B2
(45) Date of Patent: Aug. 7, 2012

(54) SEMICONDUCTOR DEVICE AND PROCESS FOR PRODUCING SAME

(75) Inventors: Seiki Hiramatsu, Tokyo (JP); Kei Yamamoto, Tokyo (JP); Atsuko Fujino, Tokyo (JP); Takashi Nishimura, Tokyo (JP); Kenji Mimura, Tokyo (JP); Hideki Takigawa, Tokyo (JP); Hiroki Shiota, Tokyo (JP); Nobutake Taniguchi, Tokyo (JP); Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 241 days.

(21) Appl. No.: 12/664,751

(22) PCT Filed: Dec. 5, 2007

(86) PCT No.: PCT/JP2007/073483
§ 371 (c)(1),
(2), (4) Date: Dec. 15, 2009

(87) PCT Pub. No.: WO2009/011077
PCT Pub. Date: Jan. 22, 2009

(65) Prior Publication Data
US 2010/0201002 A1 Aug. 12, 2010

(30) Foreign Application Priority Data
Jul. 17, 2007 (JP) .................. 2007-185742

(51) Int. Cl.
*H01L 21/00* (2006.01)
*H01L 21/46* (2006.01)
*H01L 21/30* (2006.01)

(52) U.S. Cl. ........ 438/455; 438/118; 438/124; 438/126; 257/E21.088; 257/E21.48; 257/E21.519

(58) Field of Classification Search .................. 438/118, 438/124, 126, 455, FOR. 340; 257/E21.088, 257/E21.48, E21.519
See application file for complete search history.

(56) References Cited

U.S. PATENT DOCUMENTS

| 7,514,782 | B2 | 4/2009 | Hiramatsu et al. | |
|---|---|---|---|---|
| 2001/0002163 | A1* | 5/2001 | Imasu et al. | 361/783 |
| 2003/0102570 | A1* | 6/2003 | Imasu et al. | 257/778 |
| 2004/0130024 | A1* | 7/2004 | Tsukahara et al. | 257/737 |
| 2006/0124954 | A1* | 6/2006 | Akaishi | 257/99 |

FOREIGN PATENT DOCUMENTS

| JP | 2002 50713 | 2/2002 |
|---|---|---|
| JP | 2002 246542 | 8/2002 |
| JP | 2003 152143 | 5/2003 |
| JP | 2004 319644 | 11/2004 |
| JP | 2005 5638 | 1/2005 |

\* cited by examiner

*Primary Examiner* — Michelle Mandala
(74) *Attorney, Agent, or Firm* — Oblon, Spivak, McClelland, Maier & Neustadt, L.L.P.

(57) ABSTRACT

Provided is a semiconductor device including: a base plate; a thermally conductive resin layer formed on an upper surface of the base plate; an integrated layer which is formed on an upper surface of the thermally conductive resin layer, and includes an electrode and an insulating resin layer covering all side surfaces of the electrode; and a semiconductor element formed on an upper surface of the electrode, in which the integrated layer is thermocompression bonded to the base plate through the thermally conductive resin layer. This semiconductor device excels in insulating properties and reliability.

8 Claims, 13 Drawing Sheets

SEMICONDUCTOR DEVICE AND PROCESS FOR PRODUCING SAME

TECHNICAL FIELD

The present invention relates to a semiconductor device and a process for producing same, and more particularly, to a semiconductor device used for power conversion, power control, or the like, and a process for producing the semiconductor device.

BACKGROUND ART

With increases in speed and performance of semiconductor devices, the electric energy needed for semiconductor elements is also on the rise. Combined with the trend toward smaller size and higher integration of semiconductor elements, the increase in electric energy needed for semiconductor elements leads to an increase in heat generated per unit area. As a result, semiconductor elements are prone to malfunction due to thermal runaway, to thereby hinder the increase in function and performance of electric system apparatuses incorporating such semiconductor devices.

As a way to solve the problem with semiconductor elements, there has been considered a method of effectively transferring heat generated in the semiconductor element to a radiating plate through a thermally conductive material. Specifically, the semiconductor element and the radiating plate cannot be directly coupled due to constraints of electric circuits, and hence development has been carried out on a semiconductor device including a semiconductor element and a radiating plate bonded to each other through a thermally conductive insulating material. In the development, electrode is thickness increased with respect to the substrate used in power electronics for the purpose of increasing current density and reducing the size of the substrate, with the result that breakdown voltage is reduced or the electrode is delaminated, making it difficult to ensure both an insulating properties and reliability.

To address the above-mentioned problem, as illustrated in FIG. 18, there has been proposed a semiconductor device in which a coating film is formed around an electrode placed above a ceramic substrate through a bonding layer (see, for example, Patent Document 1). This semiconductor device is produced by combining the ceramic substrate and the electrode through the bonding layer and then forming the coating film around the electrode.

Patent Document 1: JP 2005-116602 A

DISCLOSURE OF THE INVENTION

Problems to be Solved by the Invention

However, the semiconductor device of Patent Document 1 has a problem in that the thickness of the coating film is thinner than the thickness of the electrode, and hence the side surfaces of the electrode are not completely covered to lower the insulating properties from an upper end of the electrode. Further, when the method involving placing the electrode above the ceramic substrate through the bonding layer and then forming the coating film is employed, the production steps are complex, and air bubbles and the like may be contained in the coating film. As a result, it has been impossible to maintain a uniform film thickness of the coating film, and to obtain satisfactory insulating properties and reliability. Further, when an electrode pattern is formed by etching, the side surfaces of the electrode are each formed to have a sharp shape. Therefore, there has been a problem in that it is difficult to improve the insulating properties even when the coating film is formed.

The present invention has been made in view of the above-mentioned problems, and therefore has an object to provide a semiconductor device with excellent insulating properties and reliability, and a process for producing the semiconductor device.

Means for Solving the Problems

A semiconductor device according to the present invention includes: a base plate; a thermally conductive resin layer formed on an upper surface of the base plate; an integrated layer which is formed on an upper surface of the thermally conductive resin layer, and includes an electrode and an insulating resin layer covering all side surfaces of the electrode; and a semiconductor element formed on an upper surface of the electrode, in which the integrated layer is thermocompression bonded to the base plate through the thermally conductive resin layer.

Further, a process for producing a semiconductor device according to the present invention includes the steps of: forming an integrated sheet including an electrode and an insulating resin covering all side surfaces of the electrode; and thermocompression bonding the integrated sheet with a base plate through a thermally conductive resin layer.

Effects of the Invention

According to the present invention, it is possible to provide a semiconductor device with excellent insulating properties and reliability, and a process for producing the semiconductor device.

BEST MODE FOR CARRYING OUT THE INVENTION

First Embodiment (Semiconductor Device)

Figure 1:
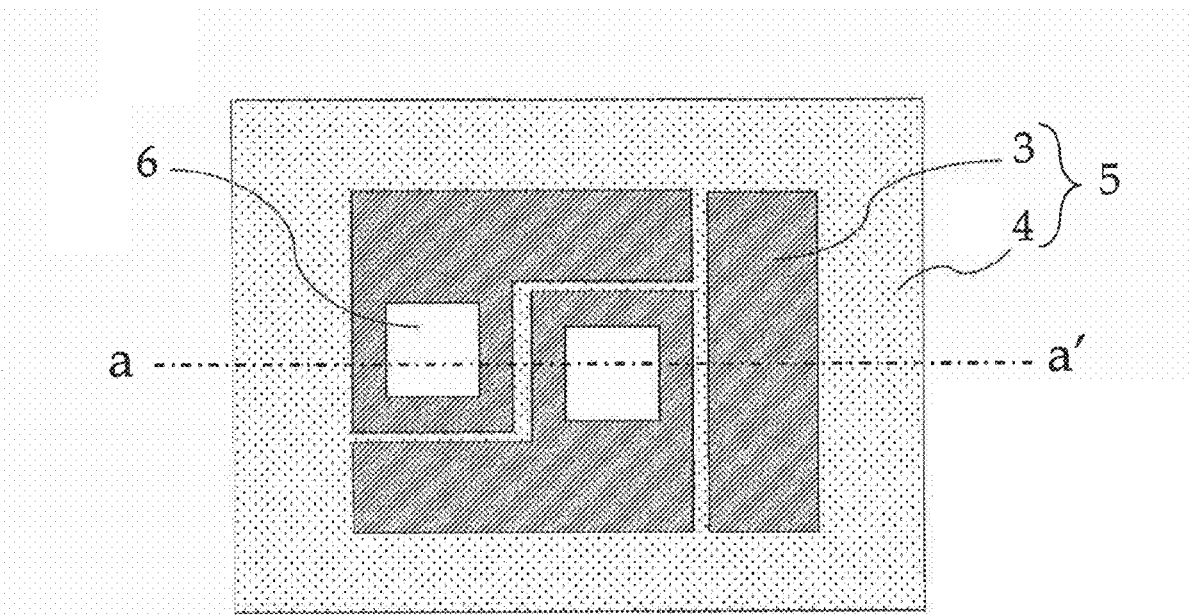
FIG. 1 is a top view of a semiconductor device according to a first embodiment.
Figure 2:
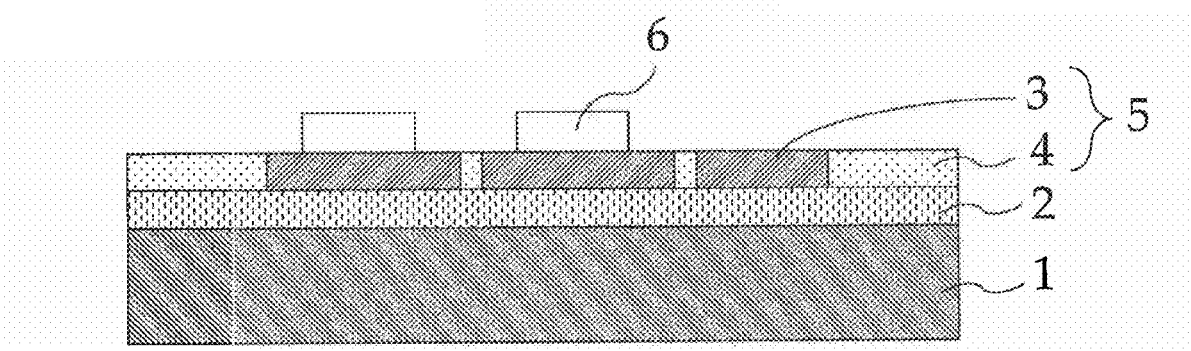
FIG. 2 is a cross-sectional view taken along the line a-a' of the semiconductor device of FIG. 1.

FIG. 1 is a top view of a semiconductor device according to this embodiment. FIG. 2 is a cross-sectional view taken along the line a-a' of the semiconductor device of FIG. 1. In FIG. 2, the semiconductor device includes a base plate 1, a thermally conductive resin layer 2 formed on an upper surface of the base plate 1, electrodes 3 formed on an upper surface of the thermally conductive resin layer 2, an insulating resin layer 4 which is formed on the upper surface of the thermally conductive resin layer 2 and covers all side surfaces of the electrodes 3, and semiconductor elements 6 formed on upper surfaces of some of the electrodes 3. The electrodes 3 and the insulating resin layer 4 are integrated to form an integrated layer 5, and the integrated layer 5 is thermocompression bonded to the base plate 1 through the thermally conductive resin layer 2.

The semiconductor device according to this embodiment having the above-mentioned structure has excellent insulating properties, because all side surfaces (all peripheral portions) of the electrodes 3 are covered by the insulating resin layer 4 so as not to expose edges of side surfaces of the electrodes 3, from which breakdown occurs. Note that even if the electrodes 3 are formed of lead frames or the like and covered by the insulating resin layer 4, ends of the lead frames extend out of the base plate 1 and it is not possible to cover all peripheral portions with an insulating resin. Therefore, using lead frames as the electrodes 3 does not improve the insulating properties.

In addition, the semiconductor device of this embodiment facilitates stress dispersion even when thermal stress occurs, because the insulating resin layer 4 and the electrodes 3 are integrated. As a result, cracking or delamination of the insulating resin layer 4 may be prevented, and hence reliability of the semiconductor device is improved.

Further, in the semiconductor device of this embodiment, the integrated layer 5 is thermocompression bonded to the base plate 1 through the thermally conductive resin layer 2 to improve adhesion of the electrodes 3 and the insulating resin layer 4 constituting the integrated layer 5 to the thermally conductive resin layer 2, and hence the insulating properties of the semiconductor device are improved.

Figure 3:
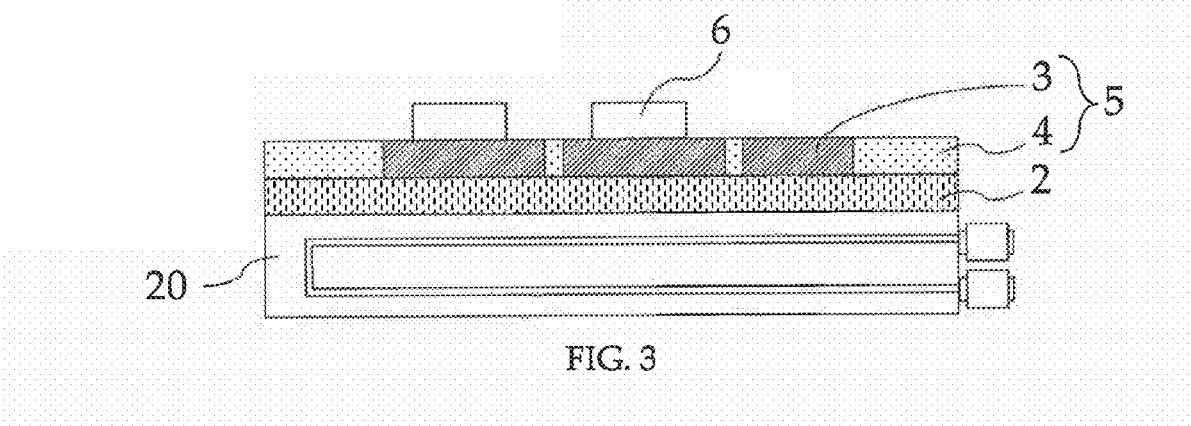
FIG. 3 is a cross-sectional view of the semiconductor device according to the first embodiment.

The base plate 1 is a substrate for supporting the thermally conductive resin layer 2, the electrodes 3, the insulating resin layer 4, and the semiconductor elements 6. The base plate 1 is not particularly limited as long as the material is available in the art, and may include, for example, a metal plate of copper, aluminum, or the like, an alloy plate of aluminum silicon carbide (AlSiC) or the like, and a composite material in which ceramic particles or glass fibers are mixed into a resin. Further, the base plate 1 is generally fixed to a radiating fin for use in order to improve radiation performance, but as illustrated in FIG. 3, the radiation performance may be improved by using a base plate 20 capable of increasing cooling efficiency by causing a coolant to flow inside thereof.

The thickness of the base plate 1 is not particularly limited, but is preferably in a range of from 0.03 to 20 mm, and more preferably in a range of from 0.05 to 10 mm considering the weight and warpage of the semiconductor device.

The thermally conductive resin layer 2 is an adhesive resin layer that combines the electrodes 3 and the insulating resin layer 4 with the base plate 1 and transfers heat generated in the semiconductor elements 6 to the base plate 1. The resin that may be used for the thermally conductive resin layer 2 is not particularly limited as long as the resin is available in the art, and may include, for example, a thermally conductive resin sheet formed by mixing fine particles into a bonding resin. The bonding resin may include a moldable resin such as epoxy resin, silicone resin, acrylic resin, or urethane resin. Further, the fine particles may include fine particles that have higher thermal conductivity than the bonding resin, such as fine ceramic particles of alumina, silica, boron nitride, aluminum nitride, and the like, diamond, and metal powders. The shape of each of the fine particles may include not only spheres but also fractures, squama, or the like. Further, the mixture ratio of the fine particles in the thermally conductive resin sheet may be appropriately set to suit the application, and preferably from 55 to 80 vol % in general.

The thermally conductive resin sheet used for the thermally conductive resin layer 2 varies in thermal conductivity and breakdown voltage depending on the kind, shape, and amount of the mixed fine particles. Therefore, an appropriate thermally conductive resin sheet should be selected to suit the thermal conductivity and breakdown voltage required for each product, and the thermally conductive resin sheet preferably has a thermal conductivity of 1 W/mK or higher and a breakdown voltage of 1 kV/mm or higher. In particular, when used for a semiconductor device that needs an electric energy of 100 KW or higher, the thermally conductive resin sheet preferably has a thermal conductivity of 10 W/mK or higher and a breakdown voltage of 3.0 kV/mm or higher.

The thickness of the thermally conductive resin layer 2 is not particularly limited, but is preferably in a range of from 0.15 mm to 2 mm considering properties such as the thermal conductivity of the thermally conductive resin layer 2.

The electrodes 3 are wiring lines for supplying power to the semiconductor elements 6 and transferring electric signals from the semiconductor elements 6. The electrodes 3 are not particularly limited as long as the material is available in the art, and may include, for example, a metal with good conductivity, such as copper, silver, aluminum, or gold.

Surfaces of the electrodes 3 may be plated with gold, nickel, or the like to prevent rust. Further, projections and depressions may be formed on portions to be brought into contact with the thermally conductive resin layer 2 and the insulating resin layer 4 to improve adhesion.

The thickness of each of the electrodes 3 is not particularly limited, but is preferably in a range of from 0.01 mm to 5 mm, and more preferably in a range of from 0.05 to 3 mm considering the weight and warpage of the semiconductor device.

Figure 4:
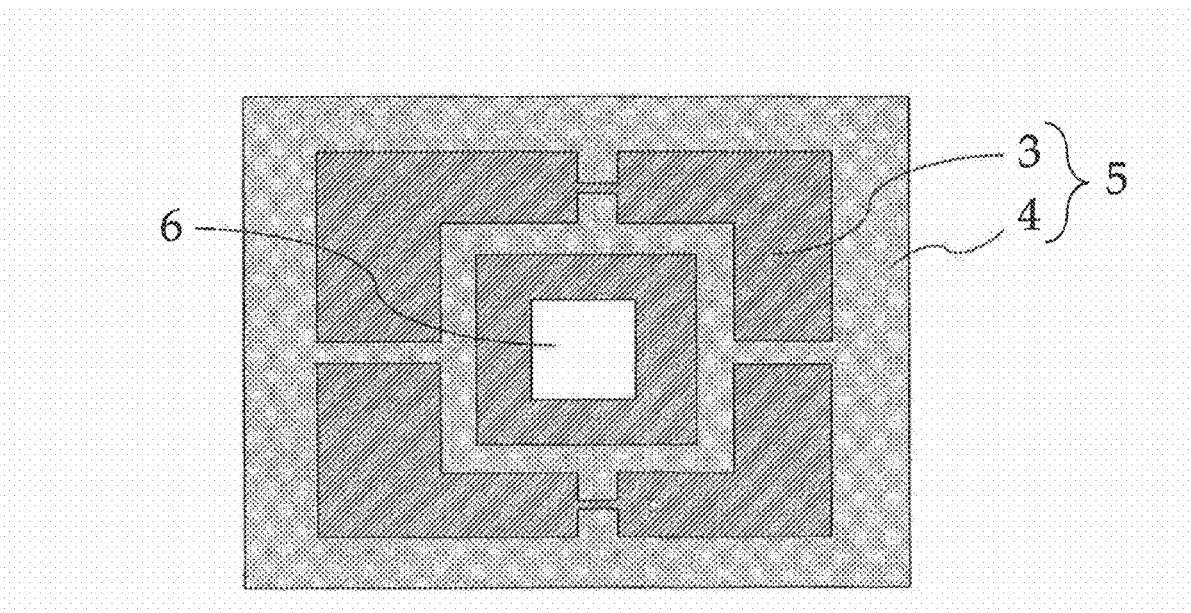
FIG. 4 is a top view of the semiconductor device according to the first embodiment.

Note that as illustrated in FIG. 4, the electrodes 3 are formed on the upper surface of the thermally conductive resin layer 2 so that at least one of the electrodes 3 is separate from the others, and the electrodes 3 must be insulated from each other through the insulating resin layer 4.

Figure 5:
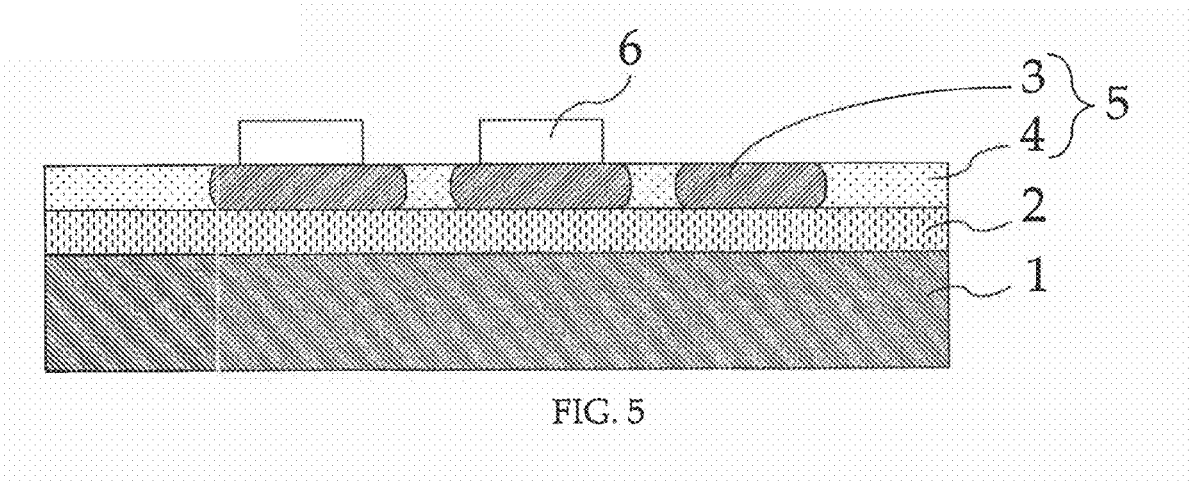
FIG. 5 is a cross-sectional view of the semiconductor device according to the first embodiment.

The side surfaces of the electrodes 3 each preferably have a curved shape expressed by an exponential function, logarithmic function, polynomial function, or the like, and more preferably have an arc shape as illustrated in FIG. 5. With this shape, an electric field does not concentrate on edges of the side surfaces of the electrodes 3 when a voltage is applied to the semiconductor device, and hence electric discharge from the edges of the side surfaces of the electrodes 3 is suppressed. Therefore, it is possible to improve the insulating properties of the semiconductor device. Further, the shape disperses thermal stress that occurs in the insulating resin layer 4 during a heat cycle test or the like, and hence it is also possible to improve reliability of the semiconductor device.

The method of forming the above-mentioned curved shape on each of the side surfaces of the electrodes 3 is not particularly limited as long as the method is available in the art, and may include methods such as etching, die cutting, cutting, and the like.

Note that in FIG. 5, all side surfaces of the electrodes 3 are formed to have a curved shape, but only some of the side surfaces of the electrodes 3 may be formed to have the curved shape.

Figure 6:
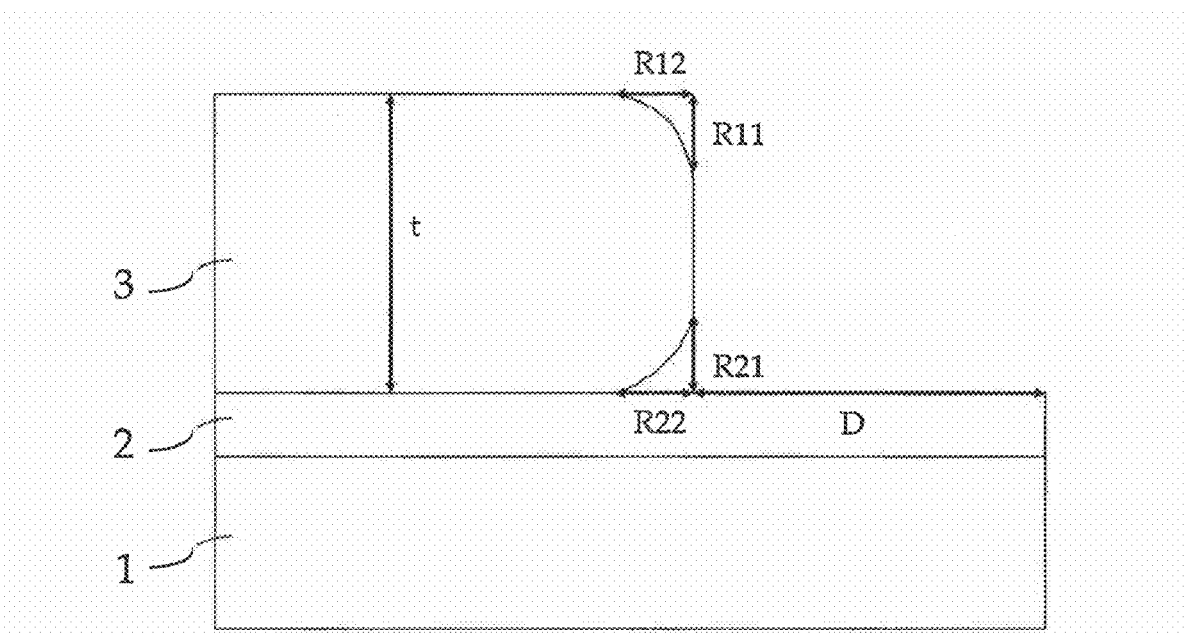
FIG. 6 is an enlarged cross-sectional view around an end of an electrode of the semiconductor device.

When the side surfaces of the electrodes 3 are each formed in an arc shape, the insulating properties vary depending on the proportion of the arc-shaped portions to all the side surfaces. Specifically, as illustrated in FIG. 6, lengths R11 and R12 regarding an arc-shaped portion of an upper side end and lengths R21 and R22 regarding an arc shape portion of a lower side portion are each preferably in a range of from 0.001 t to 1.0 t. In this case, t denotes the thickness of each of the electrodes 3. Note that not all the lengths regarding the arc-shaped portions need to be the same as long as the lengths fall in the above-mentioned range. When the lengths regarding the arc-shaped portions exceed 1.0 t, areas of the upper surfaces and lower surfaces of the electrodes 3 are reduced. In this case, forming the arc shapes on the side surfaces of the electrodes 3 does not produce the effect of improving the insulating properties. On the other hand, when the lengths regarding the arc-shaped portions are less than 0.001 t, the proportion of the arc-shaped portions to all the side surfaces becomes too small. In this case also, forming the arc shapes on the side surfaces of the electrodes 3 does not produce the effect of improving the insulating properties.

In order to describe in detail the relationship between the arc shapes of each of the electrodes 3 as described above and the insulating properties, an evaluation result of the relationship between the lengths (R11, R12, R21, and R22) regarding the arc-shaped portions and a corona start voltage is shown in Table 1. In this case, 0.5-mm-thick copper was used as the electrode 3, 2.0-mm-thick copper was used as the base plate 1, a 200-μm-thick thermally conductive resin sheet (thermal conductivity: 6 W/mK) in which boron nitride (BN) resin is mixed was used as the thermally conductive resin layer 2, and a distance D from the peripheral portion of the substrate to the electrode 3 was set to 3.0 mm. In addition, the corona start voltage was evaluated by applying high voltage from the electrode side.

TABLE 1

Relationship of R11, R12 and R21, R22, and corona start voltage (kV)

| | | R21, R22 | | | | | | | |
|---|---|---|---|---|---|---|---|---|---|
| | | 0t | 0.0005t | 0.0009t | 0.001t | 0.01t | 0.5t | 1.0t | 2.0t |
| R11, R12 | 0t | 1.7 | 1.7 | 1.7 | 1.7 | 1.7 | 1.7 | 1.7 | 1.7 |
| | 0.0005t | 1.7 | 1.7 | 1.7 | 1.7 | 1.7 | 1.7 | 1.7 | 1.7 |
| | 0.0009t | 1.7 | 1.7 | 1.7 | 1.8 | 1.8 | 1.8 | 1.8 | 1.7 |
| | 0.001t | 1.7 | 1.7 | 1.7 | 2.5 | 2.5 | 2.5 | 2.5 | 1.7 |
| | 0.0011t | 1.7 | 1.7 | 1.7 | 2.5 | 2.5 | 2.5 | 2.5 | 1.7 |
| | 0.1t | 1.7 | 1.7 | 1.7 | 2.5 | 2.6 | 2.6 | 2.6 | 1.7 |

As seen from Table 1, when the lengths (R11, R12, R21, and R22) regarding the arc-shaped portions are in the range of from 0.001 t to 1.0 t, the corona start voltage becomes high. Accordingly, forming the particular arc shape on each of the side surfaces of the electrodes 3 may improve the insulating properties.

The insulating resin layer 4 is an insulating layer that suppresses insulation degradation at the edges of the side surfaces of the electrodes 3. Therefore, the insulating resin layer 4 is not required to have thermal conductivity as is required of the thermally conductive resin layer 2. The resin that may be used for the insulating resin layer 4 is not particularly limited, and may include a thermosetting resin such as an epoxy resin or silicone resin, or a thermoplastic resin such as polyphenylene sulfide (PPS), polyethylene (PE), or polyethylene terephthalate (PET). Further, ceramic particles such as silica and alumina may be mixed in the resin to adjust the coefficient of linear expansion and elasticity.

The insulating resin layer 4 preferably has a breakdown voltage of 10 kV/mm or higher in general. With the breakdown voltage in this range, the effect of suppressing the insulation degradation is further enhanced.

Table 2 shows a relationship among the dielectric constant of the insulating resin layer 4, the electric field at the edges of the side surfaces of the electrodes 3, and the corona start voltage.

TABLE 2

| Dielectric constant of insulating resin layer 4 | Electric field at edges of side surfaces of electrodes 3 (kV/mm) | Corona start voltage (kV) |
|---|---|---|
| 2.8 | 34 | 1.7 |
| 3.1 | 31 | 2.0 |
| 3.3 | 27 | 2.6 |
| 3.5 | 26 | 2.7 |
| 4.0 | 25.5 | 2.8 |

As shown in Table 2, when the dielectric constant of the insulating resin layer 4 is less than 3.3, the effect of electric field relaxation at the edges of the side surfaces of the electrodes 3 is small. In contrast, when the dielectric constant of the insulating resin layer 4 is 3.3 or higher, the effect of electric field relaxation at the edges of the side surfaces of the electrodes 3 is large. In addition, the corona start voltage also becomes high when the dielectric constant of the insulating resin layer 4 is 3.3 or higher. Therefore, the insulating resin layer 4 preferably has a dielectric constant of 3.3 or higher.

Figure 7:
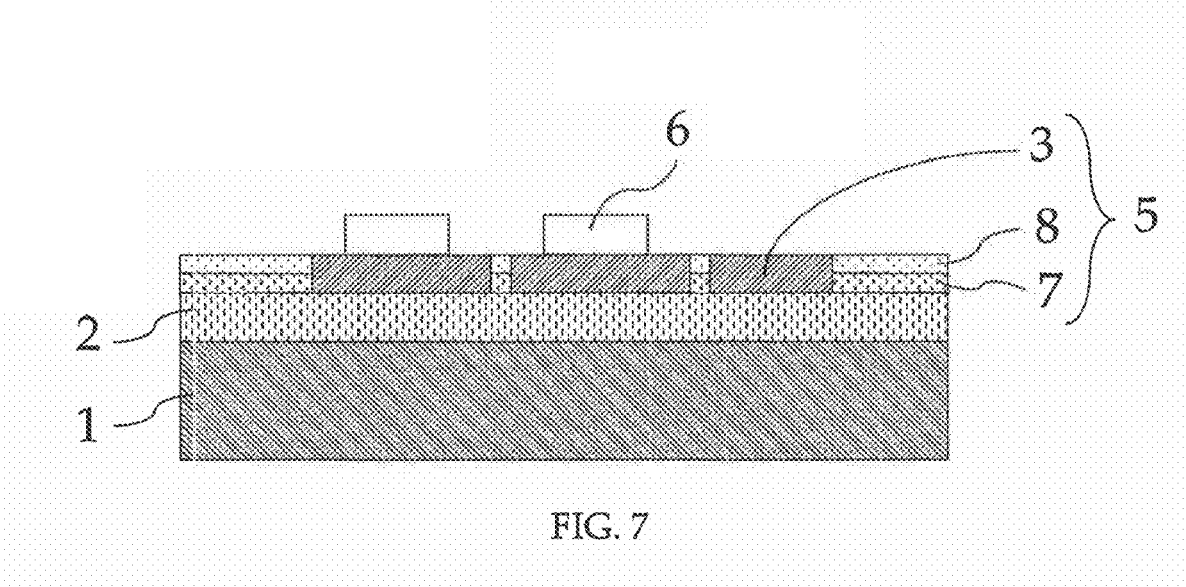
FIG. 7 is a cross-sectional view of the semiconductor device according to the first embodiment.

In addition, the insulating resin layer 4 may be multilayered using a plurality of materials so as to improve adhesion and reduce warpage. Specifically, as illustrated in FIG. 7, the insulating resin layer 4 may be constituted of a first insulating resin layer 7 and a second insulating resin layer 8.

Further, when upper surfaces of the integrated layer 5 including the electrodes 3 and the insulating resin layer 4 are made coplanar, it is possible to make the electric field that is generated around the base plate 1 when high voltage is applied to the semiconductor device uniform and the insulating properties of the semiconductor device stable, and circuits may be easily formed on the upper surfaces of the integrated layer 5 including the electrodes 3 and the insulating resin layer 4.

Note that in FIGS. 1 to 5 and 7, the insulating resin layer 4 is formed on all portions of the upper surface of the thermally conductive resin layer 2 on which the electrodes 3 are not formed, but the insulating resin layer 4 need not be formed on some portions of the upper surface of the thermally conductive resin layer 2 as long as all the side surfaces of the electrodes 3 are covered and the insulating resin layer 4 is integrated with the electrodes 3. Further, in FIGS. 1 to 5 and 7, the thickness of the insulating resin layer 4 is the same as the thickness of the electrodes 3, but the thickness of the insulating resin layer 4 may be larger than the thickness of the electrodes 3.

The semiconductor elements 6 are elements for switching or amplifying an electric signal. The semiconductor elements 6 are not particularly limited as long as the elements are available in the art, and may include, for example, silicon elements or elements using a compound material such as gallium arsenide (GaAs), indium phosphide (InP), or silicon carbide (SiC). Further, the number of semiconductor elements 6 in the semiconductor device is not particularly limited, and a plurality of the semiconductor elements 6 may be mounted on the semiconductor device.

Figure 8:
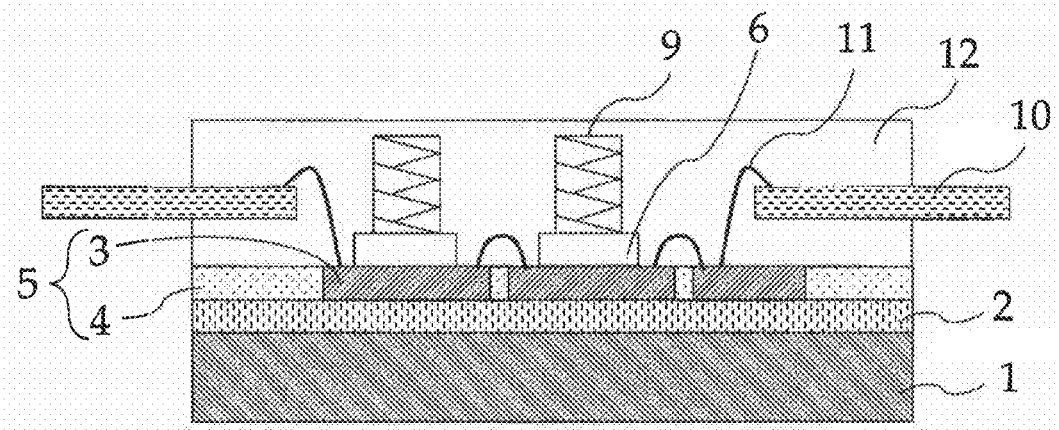
FIG. 8 is a cross-sectional view of the semiconductor device according to the first embodiment.

The method of mounting the semiconductor elements 6 is not particularly limited as long as the method is available in the art, and generally includes fixing the semiconductor elements 6 on the electrodes 3 for electrical connection by means of solder. Further, as illustrated in FIG. 8, the semiconductor elements 6 may be fixed on the electrodes 3 for electrical connection by means of a pressing force using springs 9.

Figure 9:
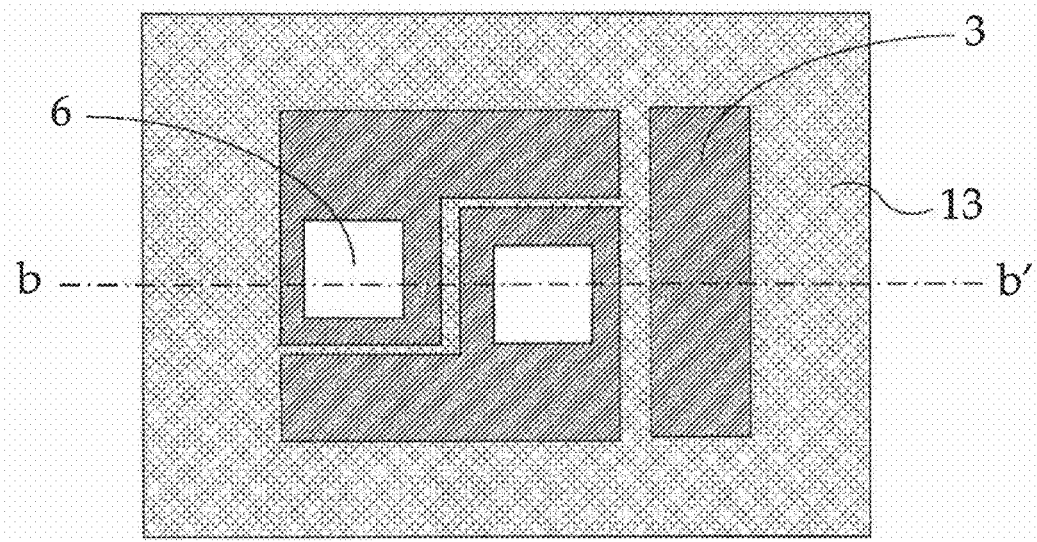
FIG. 9 is a top view of the semiconductor device according to the first embodiment.
Figure 10:
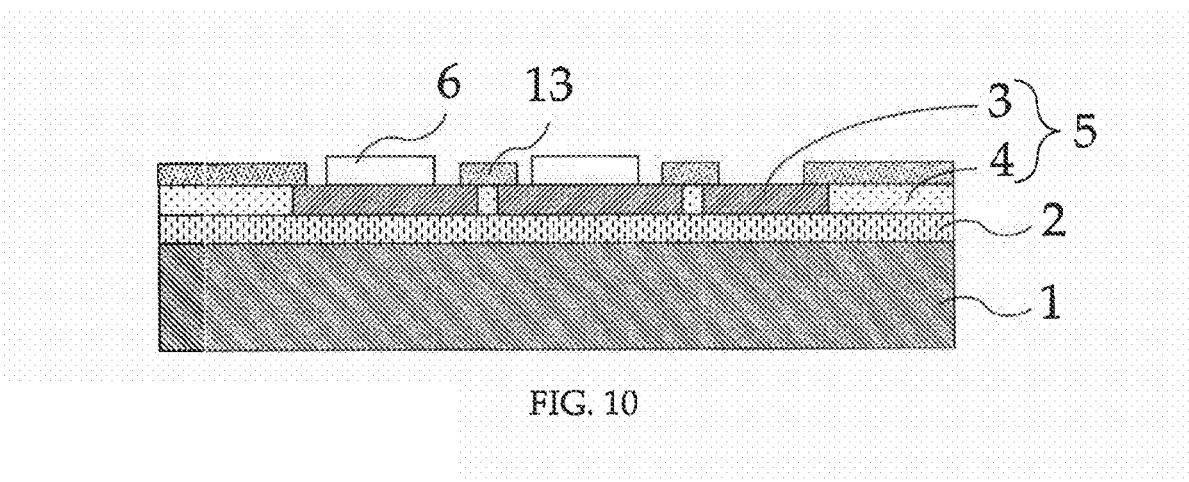
FIG. 10 is a cross-sectional view taken along the line b-b' of the semiconductor device of FIG. 9.

In the semiconductor device of this embodiment, all or some portions of the upper surface of the integrated layer 5, on which the semiconductor elements 6 are not mounted, may be covered with a cover resin layer. FIG. 9 is a top view illustrating the semiconductor device including the cover resin layer. FIG. 10 is a cross-sectional view taken along the line b-b' of the semiconductor device of FIG. 9. In the semiconductor device of FIG. 10, ends of the upper surfaces of the electrodes 3 and the entire upper surface of the insulating resin layer 4 are covered by a cover resin layer 13. With this structure, exposure of the electrodes 3 may be suppressed, and the insulating properties of the semiconductor device may be enhanced. Further, moisture absorption or cracking and delamination during solder reflow of the insulating resin layer 4 may be suppressed, and reliability of the semiconductor device may also be improved. Note that when covering with the cover resin layer 13, an opening may be formed at a predetermined portion for use also as a positioning member in soldering a component to be mounted. This structure is effective in reducing the size of the substrate.

The resin that may be used for the cover resin layer 13 is not particularly limited as long as the resin is available in the art, and may include an insulating resin, for example, a thermosetting resin such as an epoxy resin, silicone resin, acrylic resin, or urethane resin, or a thermoplastic resin such as PPS, PE, or PET. Further, ceramic particles such as silica and alumina may be mixed in the insulating resin to adjust the coefficient of linear expansion and elasticity.

The method of forming the cover resin layer 13 is not particularly limited as long as the method enables a layer to be formed with a uniform thickness, and may generally include a method involving thermocompression bonding a filmy resin. Alternatively, a solution of the resin may be spin coated or sprayed.

Figure 11:
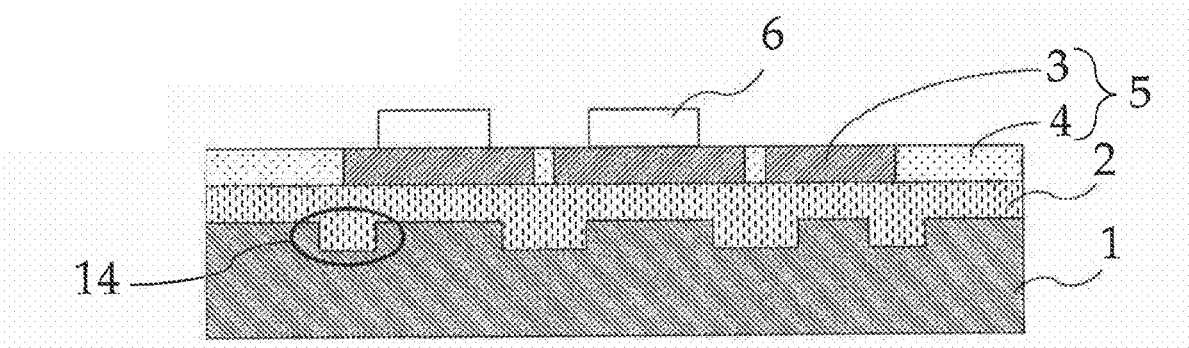
FIG. 11 is a cross-sectional view of the semiconductor device according to the first embodiment.

In the semiconductor device of this embodiment, the thickness of the thermally conductive resin layer 2 may be larger in a part which contacts with the ends of the electrodes 3 than the thickness in other parts of the thermally conductive resin layer 2. Specifically, as illustrated in FIG. 11, a depressed portion 14 may be formed on a surface of the base plate 1 which is brought into contact with the thermally conductive resin layer 2. In addition to the depressed shape, a variety of shapes may be employed as well. With this structure, the thickness of the thermally conductive resin layer 2 may be increased in a portion that is brought into contact with the edges of the side surfaces of the electrodes 3 where an electric field tends to concentrate. Therefore, electric discharge from the edges of the side surfaces of the electrodes 3 is suppressed to enhance the insulating properties of the semiconductor device.

The method of forming the depressed portion in the base plate 1 is not particularly limited as long as the method is available in the art, and may include, for example, pressing.

The semiconductor device of this embodiment may be used for various uses without sealing, but may be used after sealing with a sealing resin 12 as illustrated in FIG. 8.

The sealing resin 12 is not particularly limited as long as the resin is available in the art, and may include, for example, an insulating resin in which insulating particles are mixed. The insulating resin may include a moldable resin including a thermosetting resin such as an epoxy resin, acrylic resin, urethane resin, or silicone resin, or a thermoplastic resin such as PPS, PE, or PET. Further, the insulating particles may include particles of alumina, silica, silicone rubber, boron nitride, and diamond. The shape of each of the particles may include not only spheres but also fractures and squama.

The sealing method is not particularly limited as long as the method is available in the art, and may include, for example, injection molding.

(Process for Producing Semiconductor Device)

A process for producing the semiconductor device of this embodiment is described below with reference to the drawings.

The process for producing the semiconductor device of this embodiment includes the steps of forming an integrated sheet including electrodes and an insulating resin covering all side surfaces of the electrodes, and thermocompression bonding the integrated sheet with a base plate through a thermally conductive resin layer.

The integrated sheet may be formed by, placing the electrodes in a mold to which release treatment has been performed, then injecting the insulating resin into the mold and solidifying the insulating resin. The method of solidifying the insulating resin is not particularly limited, and may include mixing a curing agent in the insulating resin and heating the resultant to a predetermined temperature. The curing agent may be appropriately selected to suit the type of insulating resin, and the heating temperature may also be appropriately set to suit the type of insulating resin. According to this method, adhesion between the side surfaces of the electrodes and the insulating resin is enhanced, and hence insulating properties of the semiconductor device may be improved.

Figure 12:
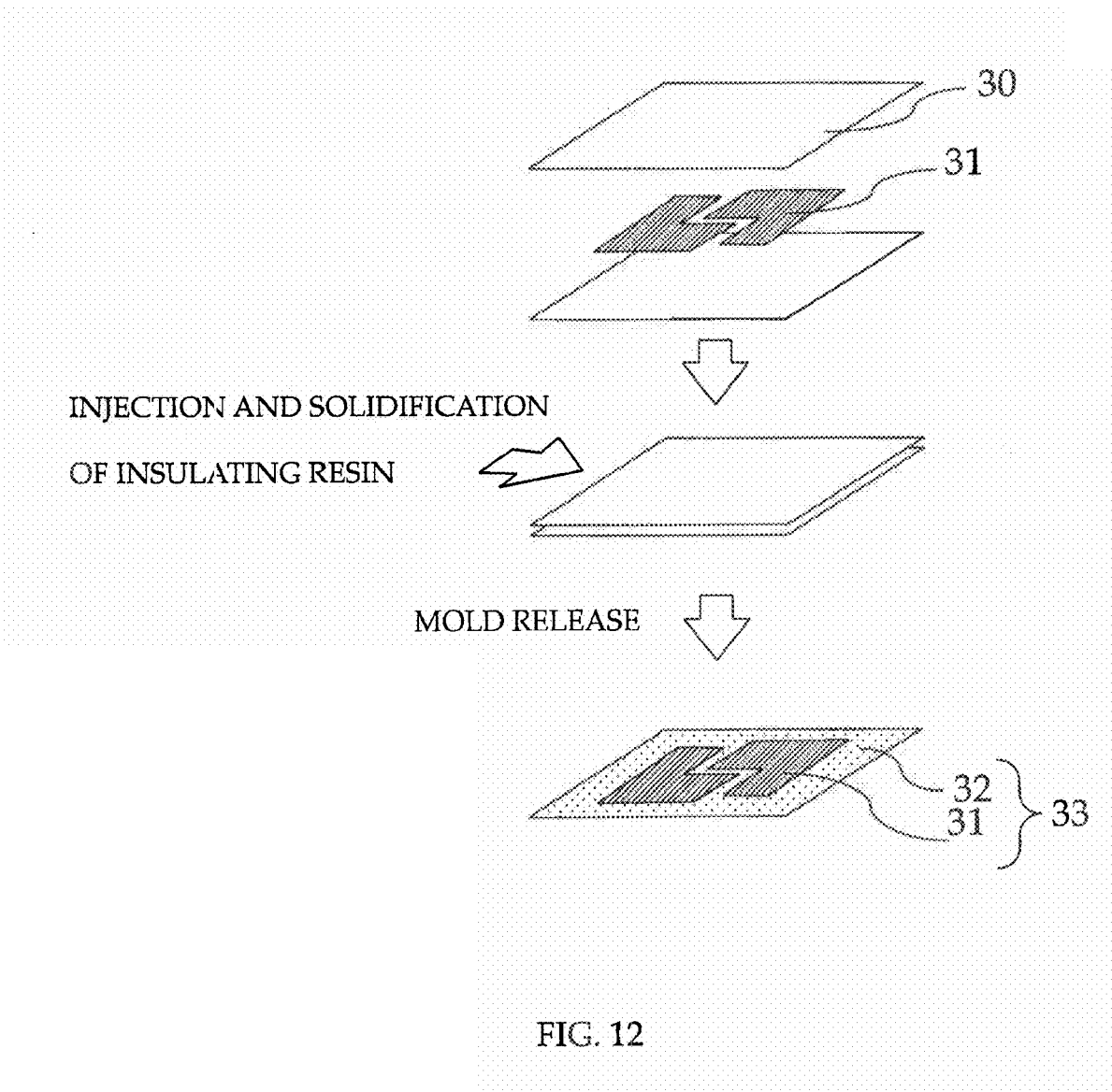
FIG. 12 is a diagram for illustrating a method of forming an integrated sheet.

Specifically, as illustrated in FIG. 12, by sandwiching electrodes 31 between molds 30 to which release treatment has been performed, injecting an insulating resin 32 into the mold 30 to which the release treatment has been performed, solidifying the insulating resin 32, and then releasing the mold 30 to which the release treatment has been performed, an integrated sheet 33 including the electrodes 31 and the insulating resin 32 covering all the side surfaces of the electrodes 31 may be obtained.

Figure 13:
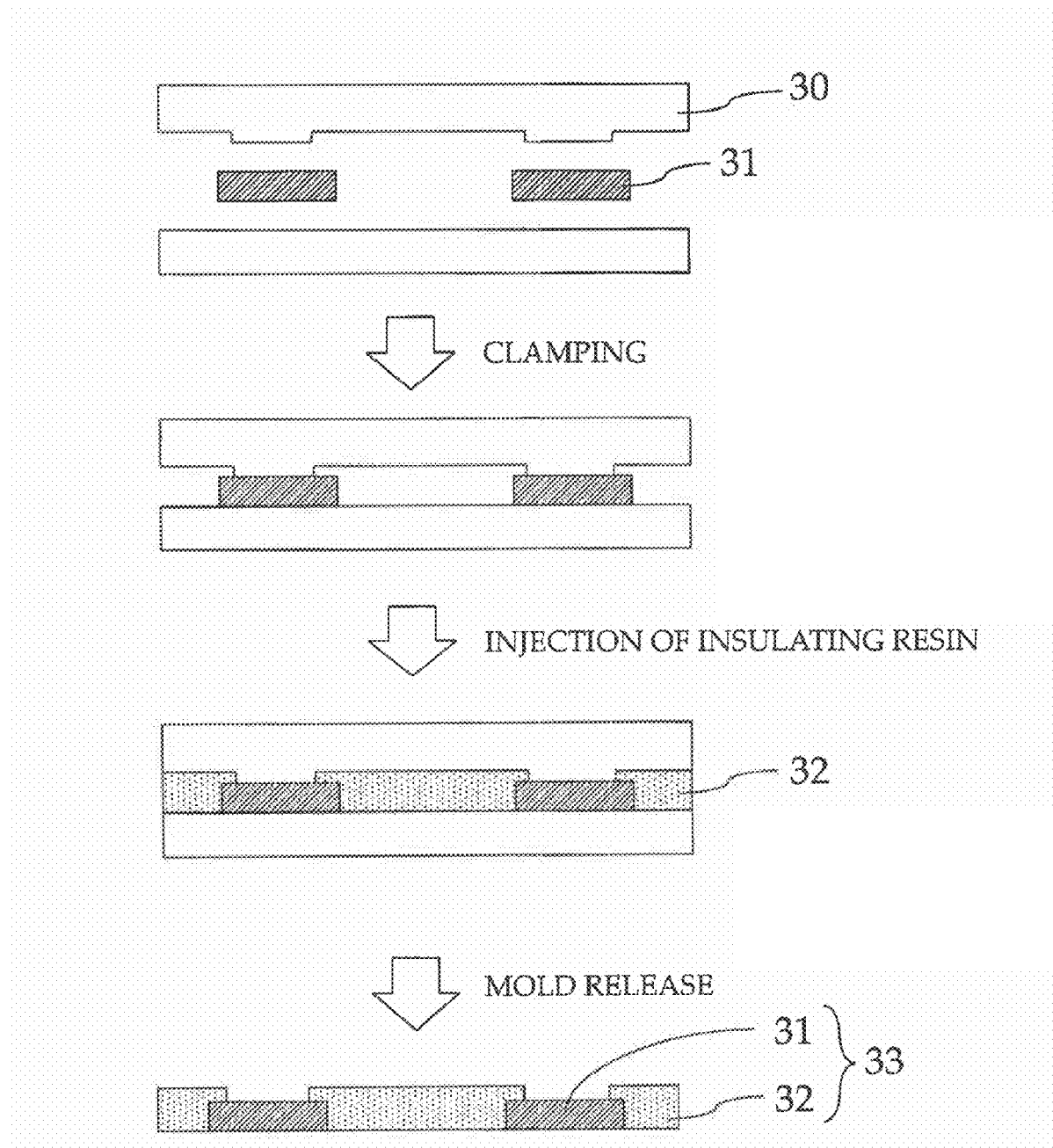
FIG. 13 is a diagram for illustrating another method of forming an integrated sheet.

The molds 30 to which the release treatment has been performed are not particularly limited as long as the molds are available in the art, and may generally include a shaping mold having a surface on which a releasing material such as a fluororesin (for example, polyfluoroethylene) or silicone resin (for example, polydimethyl silicone) has been applied. Alternatively, the molds 30 may include a glass plate on which a fluororesin film is attached. Note that FIG. 12 illustrates the molds 30 to which release treatment has been performed so as to be vertically separated, but a mold with any release method may be employed as long as mold release is easy after the insulating resin 32 is solidified. Further, with a method using the molds 30 to which release treatment has been performed, forming projections and depressions on the molds 30 as illustrated in FIG. 13 allows forming a desired structure at the same time.

When the insulating resin 32 is injected into the molds 30 to which release treatment has been performed, pressure inside the molds 30 to which the release treatment has been performed may be reduced in advance to mold the integrated sheet 33 without generating air bubbles. It may also be possible to mold the integrated sheet 33 without generating air bubbles by injecting the insulating resin 32 into the molds 30 to which the release treatment has been performed, and then reducing the pressure inside the molds 30 for deaeration.

Further, when the temperature of the molds 30 to which release treatment has been performed is set to be higher than room temperature, viscosity of the insulating resin 32 to be injected into the molds 30 is reduced to facilitate the injection. Similarly, when the temperature of the insulating resin 32 to be injected into the molds 30 is set to be higher than room temperature before the injection into the molds 30, viscosity of the insulating resin 32 is reduced to facilitate the injection.

Figure 14:
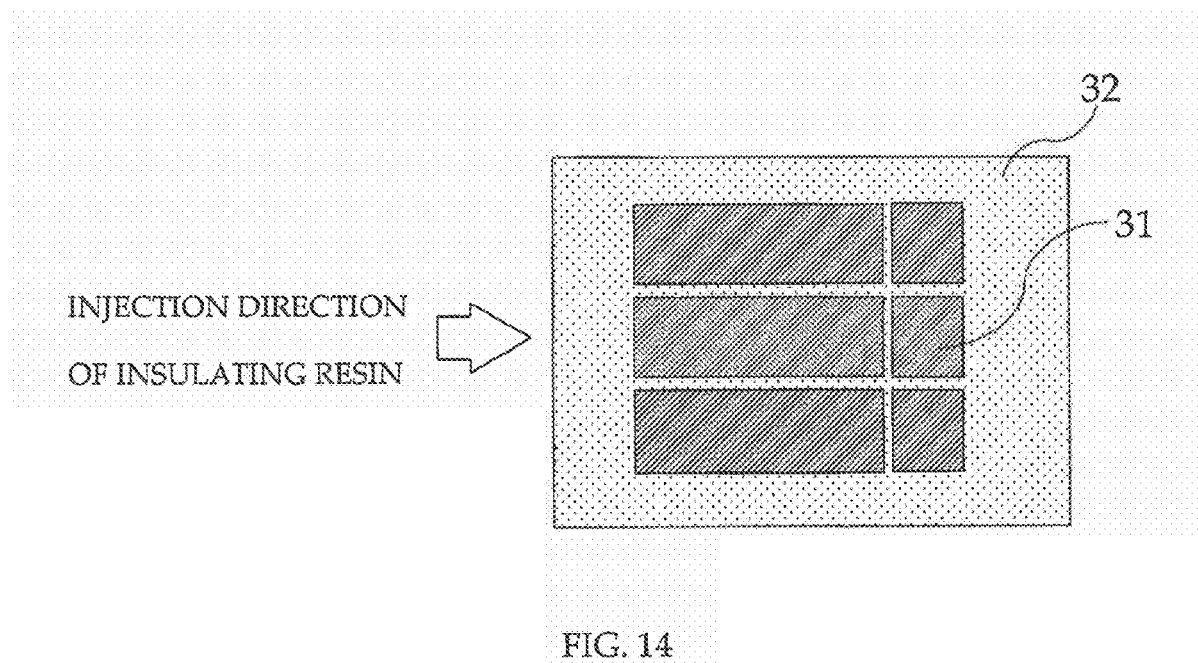
FIG. 14 is a diagram for illustrating an injection direction of an insulating resin.

The method of fixing the electrodes 31 in the molds 30 to which the release treatment has been performed is not particularly limited as long as the electrodes 31 do not move during the injection of the insulating resin 32, and may generally include inserting the electrodes 31 in the molds 30 to which the release treatment has been performed. Further, shapes of the electrodes 31 are not particularly limited, and various shapes such as an L shape and a squared U shape may be used in combination. Note that as illustrated in FIG. 14, arranging the electrodes 31 along an injection direction of the insulating resin 32 may facilitate the injection of the insulating resin 32.

Figure 15:
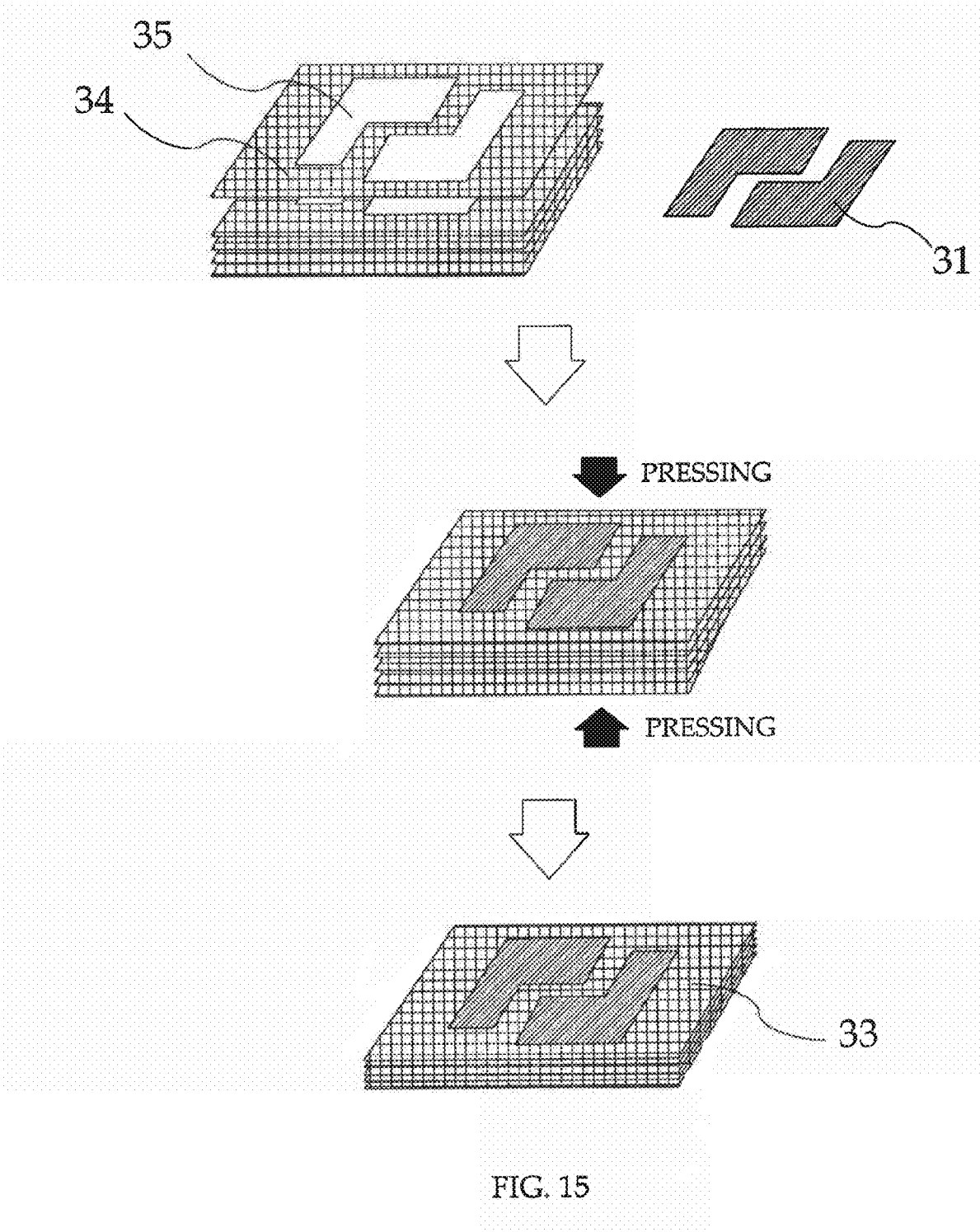
FIG. 15 is a diagram for illustrating still another method of forming an integrated sheet.

As illustrated in FIG. 15, the integrated sheet 33 may be obtained by laminating a plurality of prepregs 34 in which openings 35 having the shapes of the electrodes are formed, arranging the electrodes 31 in the openings 35, and pressing for bonding between the plurality of prepregs 34 and between the prepregs 34 and the electrodes 31. In this case, the prepregs 34 are sheets obtained by impregnating a glass cloth or a nonwoven fabric with a resin material such as epoxy resin. The resin that may be used for the prepregs is not particularly limited as long as the resin is available in the art, and may include, for example, a thermosetting resin such as epoxy resin, silicone resin, acrylic resin, or urethane resin. Further, the method of forming openings 35 in the prepregs 34 is not particularly limited as long as the method is available in the art, and may include, for example, die cutting.

Alternatively, the integrated sheet 33 may be formed by die-cutting sheet pieces in the shapes of the electrodes from the insulating resin sheet and then inserting the electrodes into the die-cut portions. With this method, as the side surfaces of the electrodes are not formed to have a sharp shape as in the case of forming the electrodes by etching, the electric field does not concentrate on ends of the electrodes when a voltage is applied to the semiconductor device, and hence electric discharge from the ends of the electrodes may be suppressed, to thereby improve the insulating properties of the semiconductor device.

Figure 16:
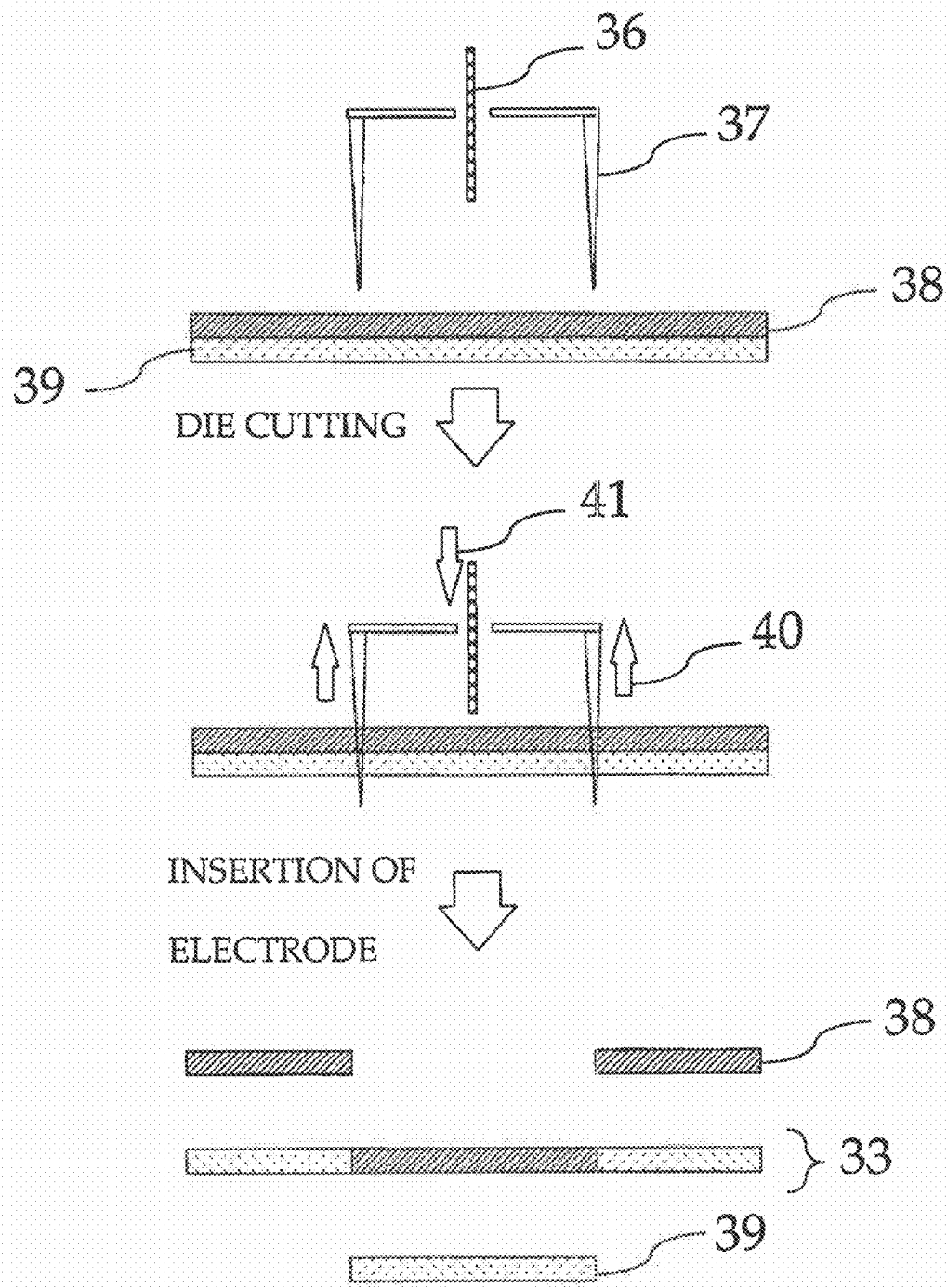
FIG. 16 is a diagram for illustrating a further method of forming an integrated sheet.

Specifically, as illustrated in FIG. 16, an electrode plate 38 and an insulating resin sheet 39 are laminated, and the electrode plate 38 and the insulating resin sheet 39 are die-cut by a die 37 from the electrode plate 38 side. Then, when the die 37 is withdrawn, the die-cut electrode plate 38 is pushed by a pin 36 provided inside the die 37 in a movable direction 41 opposite to a movable direction 40 of the die 37, to thereby obtain the integrated sheet 33 in which the die-cut electrode plate 38 is inserted into the die-cut insulating resin sheet 39.

In an apparatus for producing the integrated sheet 33, the die 37 and the pin 36 are independently movable, and a support table may be provided on a back side of the insulating resin sheet 39 in order to improve die cutting precision.

Note that FIG. 16 illustrates the method of die cutting one electrode plate 38 and one insulating resin sheet 39, but it is also possible to employ a production apparatus including a die that may simultaneously die-cut a plurality of electrode plates 38 and a plurality of insulating resin sheets 39. Further, in forming the integrated sheet 33, alignment holes or marks may be provided to the electrode plate 38 and the insulating resin sheet 39 to align the die 37, or the electrode plate 38 and the insulating resin sheet 39 may be preprocessed as long as a structure that enables the electrode plate 38 and the insulating resin sheet 39 to be die-cut at a predetermined position is maintained.

Then, the thus-formed integrated sheet 33 is thermocompression bonded to a base plate through a thermally conductive resin layer. With this method, warpage of the substrate due to shrinkage on curing of the insulating resin 32, or delamination of the insulating resin 32 from side surfaces of the electrodes 31 may be suppressed, to thereby improve reliability of the semiconductor device.

Figure 17:
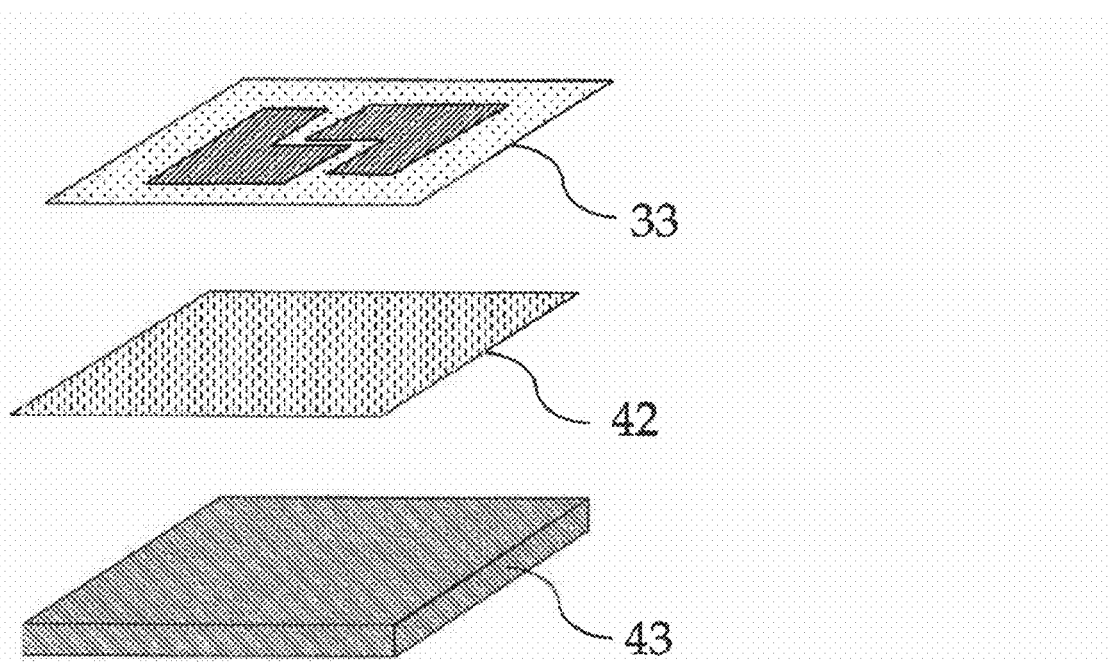
FIG. 17 is a diagram for illustrating a process for producing the semiconductor device according to the first embodiment.
Figure 18:
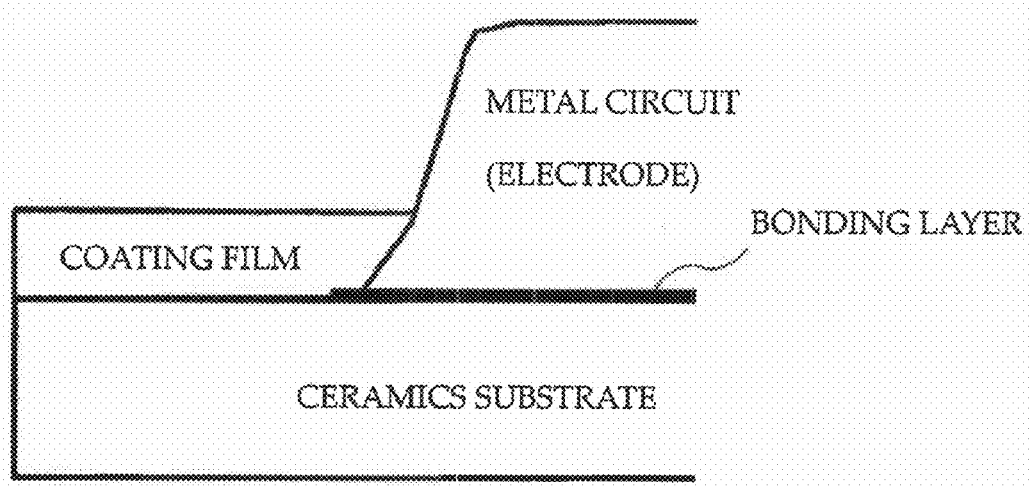
FIG. 18 is a cross-sectional view of a conventional semiconductor device.

Specifically, as illustrated in FIG. 17, a thermally conductive resin sheet 42 is inserted between the integrated sheet 33 and a base plate 43 to be thermocompression bonded.

In this case, a surface of the insulating resin 32 of the integrated sheet 33 to be brought into contact with the thermally conductive resin sheet 42 may be shaped to have projections and depressions or have a surface treatment agent such as a silane coupling agent applied in view of improving adhesion with the thermally conductive resin sheet 42. Similarly, a surface of the electrodes 31 of the integrated sheet 33 to be brought into contact with the thermally conductive resin sheet 42 may also be shaped to have projections and depressions in view of improving adhesion with the thermally conductive resin sheet 42.

Further, in FIG. 17, the thermally conductive resin sheet 42 is used as the thermally conductive resin layer, but a thermally conductive resin may be applied on a surface of the base plate 43 to form the thermally conductive resin layer, and then the integrated sheet 33 may be laminated thereon. Alternatively, a thermally conductive resin may be applied on a surface of the integrated sheet 33 to form the thermally conductive resin layer, and then the base plate 43 may be laminated thereon.

The thermocompression bonding method is not particularly limited as long as the method is available in the art, and may include, for example, plate pressing and roll pressing. In addition, heating temperature and time for the thermocompression bonding may be appropriately set to suit the type of insulating resin 32 of integrated sheet 33 and the type of thermally conductive resin sheet 42. Further, the pressing force for the thermocompression bonding may also be appropriately set to suit the type of thermally conductive resin sheet 42. In particular, when the thermally conductive resin sheet 42 contains aluminum nitride, the pressing force is preferably 150 kgf/cm$^2$ or higher in terms of adhesion. When the pressing force is less than 150 kgf/cm$^2$, desired adhesion between the thermally conductive resin sheet 42 and the electrodes 31 may not be obtained.

Further, in the thermocompression bonding, the insulating resin 32 of the integrated sheet 33 may generally be used in a totally cured state, but when the insulating resin 32 of the integrated sheet 33 is used in a semicured state, the adhesion with the thermally conductive resin sheet 42 may be further improved. Similarly, when the thermally conductive resin sheet 42 is used in a semicured state, the adhesion between the base plate 43 and the integrated sheet 33 may be further improved.

Examples

Example 1

After placing a 0.5-mm-thick Cu electrode in a mold to which release treatment had been performed, a mixture containing a curing agent, a filler, and epoxy resin was injected into the mold, and the mixture was heated and solidified at 150° C. for 1 hour, to thereby form an integrated sheet.

Then, using a 2-mm-thick Cu plate as a base plate and using a 150-μm-thick sheet containing a curing agent, a filler (aluminum nitride), and epoxy resin as a thermally conductive resin sheet, the above-mentioned integrated sheet was thermocompression bonded to the base plate through the thermally conductive resin sheet, to thereby obtain a semiconductor device. In the thermocompression bonding, a pressing force of 200 kgf/cm$^2$, a temperature of 180° C., and compression bonding time of 1 hour were used.

Using this method, 10 semiconductor devices were formed, and insulating properties were evaluated for each of the semiconductor devices. Evaluation of the insulating properties was performed by applying a high voltage from the electrode side and measuring breakdown voltage. The results are shown in Table 3.

TABLE 3

| Sample number | Breakdown voltage (kV/mm) |
|---|---|
| 1 | 7.8 |
| 2 | 8.2 |
| 3 | 7.9 |
| 4 | 8.1 |
| 5 | 7.9 |
| 6 | 8.5 |
| 7 | 7.7 |
| 8 | 7.8 |
| 9 | 8.1 |
| 10 | 7.9 |

As shown in Table 3, the semiconductor devices formed in this example had high breakdown voltages, and there was small variation among the breakdown voltages.

Comparative Example 1

In Comparative Example 1, a semiconductor device without an insulating resin layer was formed.

Figure 19:
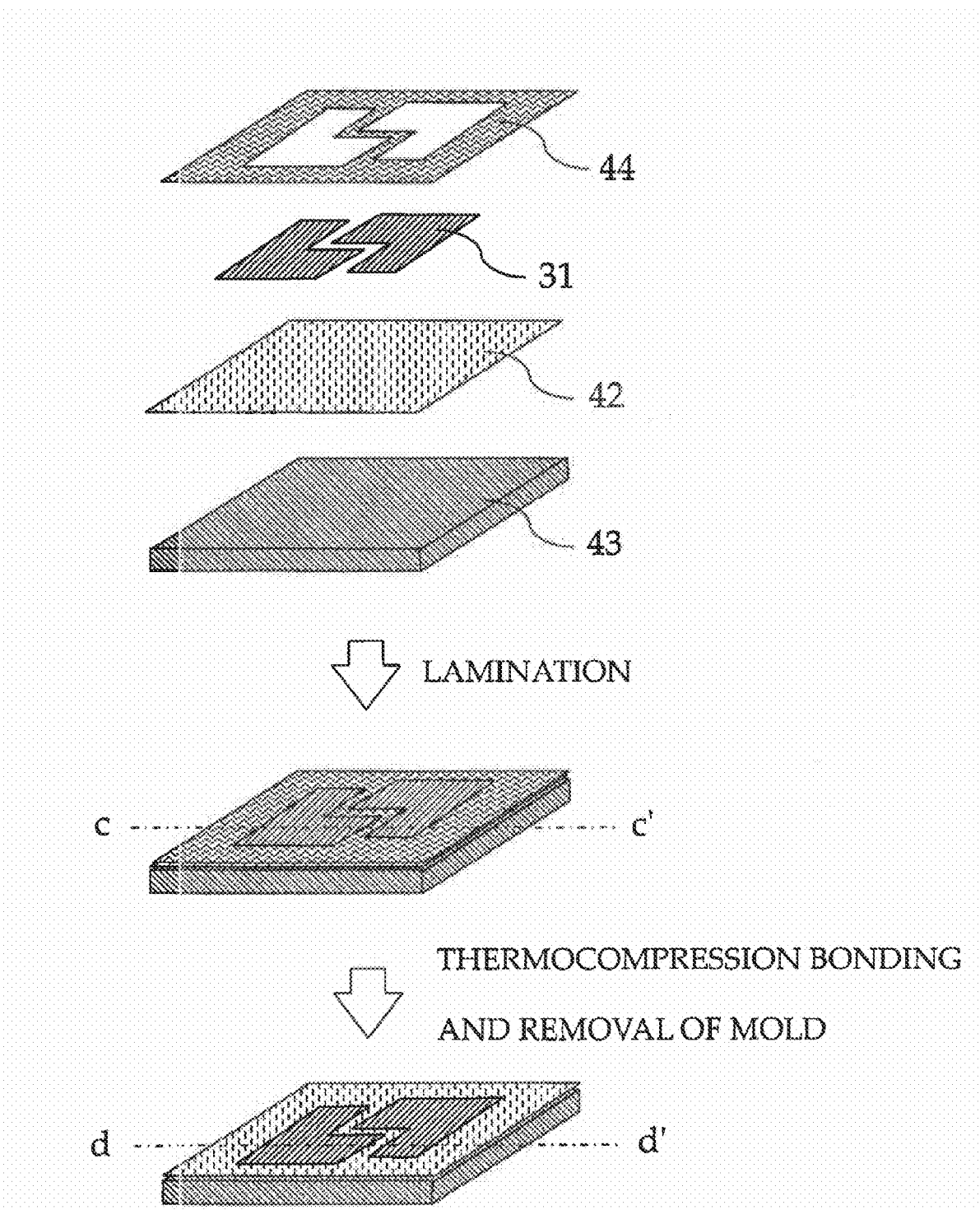
FIG. 19 is a diagram for illustrating a process for producing a semiconductor device according to Comparative Example 1.

As illustrated in FIG. 19, a mold 44 from which electrode shapes had been cut out was used to thermocompression bond electrodes 31 to a base plate 43 through a thermally conductive resin sheet 42, and then the mold 44 was removed, to thereby obtain the semiconductor device. Note that the materials and conditions used for the thermocompression bonding were the same as those in Example 1.

Using this method, 10 semiconductor devices were formed, and insulating properties were evaluated for each of the semiconductor devices. Evaluation of the insulating properties was performed by applying a high voltage from the electrode side and measuring breakdown voltage. The results are shown in Table 4.

TABLE 4

| Sample number | Breakdown voltage (kV/mm) |
|---|---|
| 1 | 2.5 |
| 2 | 3.7 |
| 3 | 4.2 |
| 4 | 2.5 |
| 5 | 5.5 |
| 6 | 4.6 |
| 7 | 2.8 |
| 8 | 3.1 |
| 9 | 3.7 |
| 10 | 4.8 |

As shown in Table 4, the semiconductor devices formed in this comparative example had low breakdown voltages, and there was large variation among the breakdown voltages.

Figure 20:
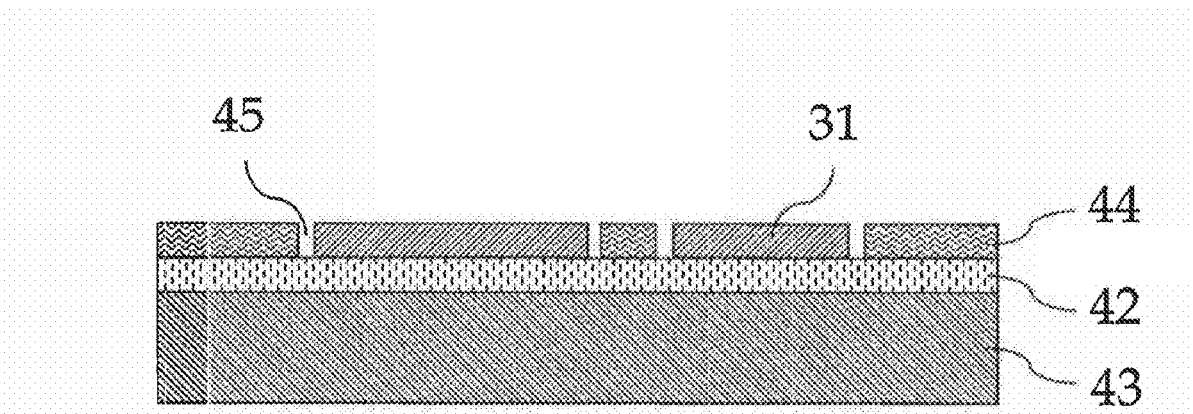
FIG. 20 is a cross-sectional view taken along the line c-c' in FIG. 19.
Figure 21:
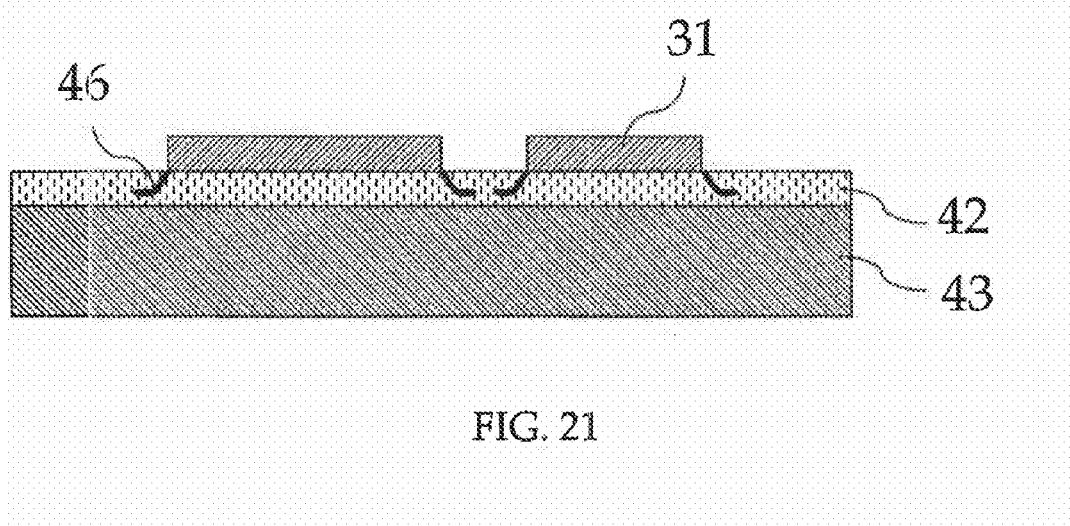
FIG. 21 is a cross-sectional view taken along the line d-d' in FIG. 19.

Next, FIGS. 20 and 21 illustrate cross-sectional views taken along the lines c-c' and d-d' in FIG. 19, respectively. As illustrated in FIG. 20, there are gaps 45 between the electrodes 31 and the mold 44 from which the electrode shapes have been cut out, and hence it is considered that the pressing force is not applied to the gaps 45 during the thermocompression bonding. Further, as illustrated in FIG. 21, cracks 46 were formed after the thermocompression bonding in the thermally conductive resin sheet 42 at the gaps 45 to which the pressing force was not applied. Therefore, in the case of the semiconductor devices of Comparative Example 1, it is considered that the cracks 46 resulted in low breakdown voltages of the semiconductor devices and large variation among the breakdown voltages.

Example 2

In Example 2, the relationship between pressing force and delamination strength in thermocompression bonding was studied.

A 150-μm-thick sheet which contains a curing agent, a filler (aluminum nitride), and epoxy resin and to which a 50-μm copper foil had been thermocompression bonded was used as a sample for evaluation. In the thermocompression bonding, a temperature of 180° C., a compression bonding time of 1 hour were used.

The delamination strength was measured for the samples obtained by the above-mentioned method. The delamination strength was measured in compliance with JIS C-6481. The results are shown in Table 5.

TABLE 5

| Pressing force (kgf/cm²) | Delamination strength (g/cm) |
|---|---|
| 10 | 20 |
| 50 | 20 |
| 100 | 280 |
| 150 | 550 |
| 200 | 550 |

As shown in Table 5, when the pressing force was less than 150 kgf/cm², the delamination strength was greatly reduced. Therefore, in forming a semiconductor device, it is considered that a pressing force for thermocompression bonding of less than 150 kgf/cm² results in weak adhesion between the thermally conductive resin sheet 42 and the electrodes 31. As a result, when stress is generated in the semiconductor device, the thermally conductive resin sheet 42 may be delaminated or generate cracks, to thereby lead to lower breakdown voltages and large variation among the breakdown voltages.

As may be seen from the above-mentioned result, according to the present invention, there may be provided a semiconductor device with excellent insulating properties and reliability, and a process for producing same.

The invention claimed is:

1. A process for producing a semiconductor device, comprising the steps of:
   forming an integrated sheet including an electrode and an insulating resin covering all side surfaces of the electrode; and
   thermocompression bonding the integrated sheet with a base plate through a thermally conductive resin layer,
   wherein the integrated sheet is formed by, after placing the electrode in a mold to which release treatment has been performed, injecting the insulating resin while in a non-solid form into the mold and then solidifying the insulating resin.

2. The process of claim 1, further comprising:
   after the injecting, reducing a pressure inside the mold.

3. The process of claim 1, wherein a temperature of the mold is set higher than a temperature of a room in which the process is implemented.

4. The process of claim 1, wherein the insulating resin is a thermosetting resin.

5. A process for producing a semiconductor device, comprising the steps of:
   forming an integrated sheet including an electrode and an insulating resin covering all side surfaces of the electrode; and
   thermocompression bonding the integrated sheet with a base plate through a thermally conductive resin layer,
   wherein the integrated sheet is formed by, after die-cutting a sheet piece of a shape of the electrode from an insulating resin sheet, inserting the electrode in a portion from which the sheet piece has been die-cut.

6. The process of claim 5, wherein the die-cutting is executed with a die, and when the die is withdrawn in a first direction pushing the electrode in a moveable direction opposite to the first direction.

7. The process of claim 5, wherein the insulating resin is a thermosetting resin.

8. The process of claim 6, wherein the pushing is executed with a pin disposed inside the die.

* * * * *